United States Patent [19]

Nusinov et al.

[11] Patent Number: 5,394,353
[45] Date of Patent: Feb. 28, 1995

[54] FLIPFLOP AND CONTROL CIRCUIT IN A CONTENT ADDRESSABLE MEMORY

[75] Inventors: Eugene B. Nusinov, Sharon; James A. Pasco-Anderson, Needham, both of Mass.

[73] Assignee: Motorola, Inc., Schaumburg, Ill.

[21] Appl. No.: 123,548

[22] Filed: Sep. 20, 1993

[51] Int. Cl.$^6$ ............................................. G11C 13/00
[52] U.S. Cl. ...................... 365/49; 365/205; 327/212
[58] Field of Search .............. 365/49, 205; 307/272.2

[56] References Cited

U.S. PATENT DOCUMENTS 4,872,138 10/1989 Ciacci .................................. 365/49
5,189,315 2/1993 Akata ............................... 307/272.2

Primary Examiner—Eugene R. LaRoche
Assistant Examiner—Christopher R. Glembocki
Attorney, Agent, or Firm—Robert D. Atkins

[57] ABSTRACT

A data compressor generates codewords representative of the location and length of a string match between an input data stream and a CAM array vocabulary table. A data decompressor looks up the codewords for a string match in its vocabulary table. The CAM array is arranged in a serpentine configuration to reduce track layout. A column priority encoder reverses the priority of alternate rows to maintain the logical flow through the CAM array. The CAM array uses a flipflop with a common control circuit to transfer and refresh data through the flipflop.

17 Claims, 8 Drawing Sheets

FLIPFLOP AND CONTROL CIRCUIT IN A CONTENT ADDRESSABLE MEMORY

CROSS REFERENCE TO RELATED PATENT APPLICATIONS

The present application is related to copending U.S. patent application 08/123,551, Attorney's Docket CX093017, entitled "CIRCUIT AND METHOD OF INTERCONNECTING CONTENT ADDRESSABLE MEMORY", filed Sep. 20, 1993, by Eugene B. Nusinov et al and assigned to the same assignee, Codex, Corp.

The present application is further related to copending U.S. patent application 08/123,553, Attorney's Docket CX093018, entitled "CIRCUIT AND METHOD OF RESETTING A DATA COMPRESSOR/DECOMPRESSOR" filed Sep. 20, 1993, by Eugene B. Nusinov et al and assigned to the same assignee, Codex, Corp.

The present application is further related to copending U.S. patent application 08/123,550, Attorney's Docket CX093019, entitled "CIRCUIT AND METHOD OF BIT-PACKING AND BIT-UNPACKING USING A BARREL SHIFTER", filed Sep. 20, 1993, by Eugene B. Nusinov et al and assigned to the same assignee, Codex, Corp.

The present application is further related to copending U.S. patent application 07/976,298, Attorney's Docket CX089101, entitled "AN ASSOCIATIVE CAM APPARATUS AND METHOD FOR VARIABLE LENGTH STRING MATCHING", filed Nov. 13, 1992, by Brian Ta-Cheng Hou et al and assigned to the same assignee, Codex, Corp.

BACKGROUND OF THE INVENTION

The present invention relates in general to data compression schemes and, more particularly, to a flipflop and control circuit in a CAM cell of a data compressor.

Data compression schemes are well known in the art for encoding a stream of digital data signals into compressed digital data. Data compression generally refers to a process of inputting the data stream in a standard format, say 8-bit ASCII characters, and outputting the same information in a compressed format with fewer bits than the original format.

The compressing process is advantageous when considering data storage and data transmission. If the data is compressed into fewer total bits that represent the same information, then less space is required in the mass storage device. Likewise, data transmission occurs more rapidly when fewer bits are transmitted. In general by reducing the total number of ones and zeroes, data becomes more efficient to handle. When the time comes to use the data, it must be decompressed back into its original format for use by the end device.

One common compression technique is described in U.S. Pat. No. 5,003,307. The compression system includes a data compressor, a data decompressor and an interconnecting medium such as a transmission link or a mass storage device. Uncompressed data words are serially processed through the data compressor which builds a compressor vocabulary table comprising a history of incoming data and which sends a sequence of codewords across the transmission link, or to the mass storage device, to the data decompressor. The codewords are serially processed through the data decompressor to build a corresponding decompressor vocabulary table and provide uncompressed data words to the end device.

In the data compressor, each incoming data word is compared to the existing vocabulary table. If no match is found, the data compressor sends the data word as part of a codeword across the transmission link, or to the mass storage device, and further places the data word at the end of the vocabulary table. No actual data compression occurs if no match is found. The transmission capacity needed to send an uncompressed data word may be ten bits: eight bits for the uncompressed data word and two bits, say "00", to represent the "length" of the matched string of data words—in this case zero.

If on the other hand one or more matches are found in the vocabulary table, the data compressor notes the locations of the matches in the vocabulary table. No data is sent initially but the incoming data is still added to the end of the vocabulary table. The next incoming data word is checked for a match to the contents of the next locations in the vocabulary table following the first matches, effectively searching for length-two string matches in the vocabulary table. If the second incoming data word fails to match the contents of the next locations, the length of the longest matched string is determined to be one. The first match may be conveyed as a codeword that contains the uncompressed data word as in the case when no match is found. The transmission capacity needed to send a codeword that conveys a length-one matched string may be ten bits: eight bits for the uncompressed data word and two bits, say "01", to represent the length of the matched string of data words-in this case one. Alternately, the "location" of a length-one match in the vocabulary table may be sent. Since typical implementations use vocabulary tables containing at least 1024 locations, which require at least 10-bits to represent, it is often preferable to include the 8-bit length-one match data word as the codeword.

If the second incoming data word matches the contents of at least one of the next locations, the process continues until a subsequent data word fails to match any of the next locations in the vocabulary table. The data compressor notes the number of such matches in the vocabulary table. A codeword is sent identifying the location of the first match and the length of the matched string of data words. Thus, if successive incoming data words "A", "B", "C" happen to match the same previously stored data string, the resulting codeword would have the starting location to the match of "A" and a length of three.

The transmission capacity needed to send the codeword depends on the number of bits required to represent the length and location fields. As is well known in the art, the size of the location field is typically determined by either the current number of entries in the vocabulary table or by the maximum size of the vocabulary table. The size of the length field is typically chosen to vary according to a prefix code wherein more probable length values are uniquely encoded using fewer bits with respect to less probable length values. For example, the size of the codeword that represents the length-three string "ABC" may also be ten bits: seven bits to convey the location in the vocabulary table (that contains less than 128 locations) and three bits which encode the length of the match, say "101". The data compressor releases one 10-bit codeword representative of the entire character string for transmission and/or storage. One 10-bit codeword requires less space to store and less time to transmit as compared to three individual uncompressed data words (24-bits). Thus when string matches of length greater than one are found, the data compressor offers the feature of transmitting or storing fewer total bits to represent the same information as compared to uncompressed formats.

On the decompression side, the data decompressor receives the sequence of codewords from the data compressor by transmission link or from a mass storage device. The data decompressor begins to build its own vocabulary table from the incoming compressed data. Codewords beginning with "00" are taken as containing uncompressed data words which are provided directly to the end device and are added to the end of the decompressor vocabulary table. Other codewords containing location and length fields are converted to standard format by reading the designated string from the vocabulary table. These data words are further added to the end of the vocabulary table and sent to the end device.

The aforedescribed data compressor may include a content addressable memory (CAM) to hold its vocabulary table. Each CAM array memory cell is individually addressable with read/write capability. Each incoming data word is compared in parallel to the existing contents of the CAM array and is sequentially placed in the next available CAM array memory cell. Once the CAM array reaches capacity, the addressing wraps around to the beginning of the array, thereafter overwriting the contents of the oldest CAM array memory cell.

CAM cell designs commonly used in the prior art typically include two or more flipflops operating under control of a system clock to store and refresh the match status signals from adjacent CAM cells. The CAM cells consume a large area when implemented as an integrated circuit. Therefore, it is desirable to reduce the complexity and size of each CAM cell.

DETAILED DESCRIPTION OF THE PREFERRED EMBODIMENT

Figure 1:
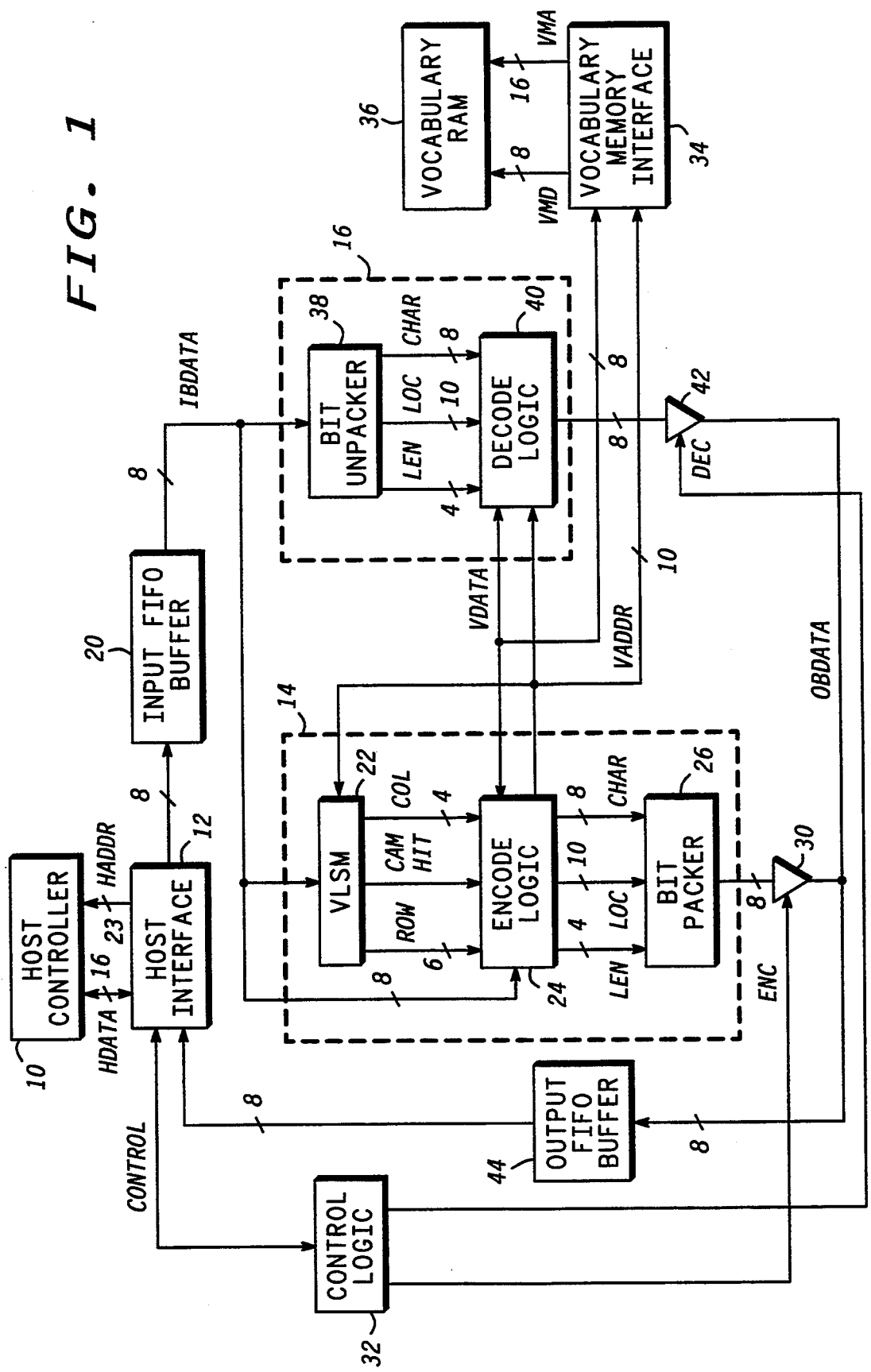
FIG. 1 is a block diagram illustrating a data compressor and data decompressor.

Referring to FIG. 1, host controller 10 provides 16-bit data words HDATA to host interface 12 which controls the flow of data between host controller 10 and data compressor 14 and data decompressor 16. HADDR (host address) addresses the memory location in host controller 10 for reading and writing HDATA. After reading data, host interface 12 places the data into input FIFO (first-in-first-out) buffer 20 one 8-bit segment at a time. The incoming data shifts along input FIFO buffer 20 to its output. The data from input FIFO buffer 20, i.e. IBDATA (input bus data), is applied to data compressor 14 and to data decompressor 16 for compression or decompression.

The compressing process is advantageous when considering data storage and data transmission, especially in computer network systems. If the data is compressed into fewer total bits to represent the same information, then less space is required in mass storage devices. Likewise, data transmission occurs more rapidly with fewer bits transmitted.

For data compression, the uncompressed data words are sequentially processed through VLSM (variable length string marcher) 22 which updates a local vocabulary comprising a history of all recent incoming data words in an internal 1024-cell associative CAM (content addressable memory) array. VLSM 22 searches for the longest string of matches between the incoming IBDATA and data words already stored in the existing vocabulary table in the CAM array. If no match is found, encode logic 24 obtains the uncompressed data word from IBDATA and updates the vocabulary table located in the CAM array. VADDR (vocabulary address) from encode logic 24 provides the update location in the CAM array. Encode logic 24 also sends the uncompressed CHAR (character) signal derived directly from IBDATA to bit packer 26. A LEN (length of match) signal of zero identifies the data as uncompressed to bit packer 26. The transmission capacity needed to send an uncompressed data word is ten bits: eight bits for the uncompressed data word and two bits for the length code, say "00".

If one or more matches are found between the incoming data word and the vocabulary table, VLSM 22 retains the locations of those matches. No data is sent at this time but the incoming data is still added to the end of the vocabulary table in the CAM array. VLSM 22 signals encode logic 24 via the CAM_HIT signal when each data word match is found. Encode logic 24 keeps track of the number of consecutive matches found (LEN) in a 4-bit length counter (not shown) incremented by CAM_HIT. The next incoming data word is checked for a match to the contents of the next locations in the vocabulary table following the first matches, effectively searching for length-two string matches in the vocabulary table. The process continues until a subsequent data word fails to match any of the next locations in the vocabulary table.

If successive incoming data characters, say "A" and "B", happen to match the same previously stored data string, then the resulting codeword is assigned the corresponding start location in the CAM array and a length of two. VLSM 22 passes 6-bit ROW and 4-bit COL signals identifying the location of the most recent match in the vocabulary table to encode logic 24. Encode logic 24 combines the ROW and COL signals into a 10-bit LOC signal indicating the start location in the vocabulary table of the longest string match. The start location is derived by subtracting LEN from the most recent match. Encode logic 24 may simultaneously update a duplicate copy of the vocabulary table located in vocabulary RAM 36 via vocabulary memory interface 34. Busses VDATA and VADDR provide the data word value and the location to be updated, respectively.

The transmission capacity needed to send a codeword representing compressed data varies depending on the number of bits required to represent the length and location codes. The size of the location code is typically determined by either the current number of entries in the vocabulary table or by the maximum size of the vocabulary table, as described. The size of the length code is typically chosen to vary according to a prefix code wherein more probable length values are uniquely encoded using fewer bits with respect to less probable length values.

Bit packer 26 derives variable-length codewords from fixed-length inputs LEN, LOC and CHAR and packs them into a sequence of 8-bit bytes suitable for output FIFO buffer 44. The 10-bit LOC signal is converted to a variable-length location code that varies in size from five to ten bits, depending on the number of used locations in the vocabulary table, see FIG. 12 and associated text infra. For example, as the number of used locations exceeds 31, 63, 127, 255 and 511, the size of the location code adapts from five-to-six-to-seven-to-eight-to-nine-to-ten bits, respectively. The 4-bit LEN signal is encoded into a variable-length length code that varies in size from two to five bits, see FIG. 12 and associated text infra. Thus, the length and location of the longest matched string combine as a variable-length codeword to represent the data in compressed format. The codeword conveys the location of the beginning of the longest string match in the vocabulary table and the number of consecutive matching characters from that starting point. A control signal ENC from control circuit 32 enables tri-state buffer 30 to pass the outgoing data as OBDATA through output FIFO buffer 44 to host interface 12. Host interface 12 sends the data to host controller 10 for storage, or other transmission as necessary. The data compressor thus transmits fewer total bits when matches are found as compared to uncompressed formats. The savings in required mass storage space and/or data transmission time for compressed data can be significant.

For the data decompression path, bit-unpacker 38 parses the incoming compressed 8-bit IBDATA into a sequence of alternating length and location codes or length codes and uncompressed data words. Bit-unpacker 38 decodes the variable-length codes and alternately generates fixed-length fields LOC and LEN, or CHAR and LEN. LEN and LOC are converted to VADDR and sent by way of vocabulary memory interface 34 to retrieve the appropriate number of data words from vocabulary RAM 36. VMA is the vocabulary memory address into vocabulary RAM 36, and VMD is the vocabulary memory data read to and written from vocabulary RAM 36. The data from vocabulary RAM 36 returns to decode logic 40 for outputting to output FIFO buffer 44 and for updating the decompressor vocabulary table stored in vocabulary RAM 36. When LEN is zero, decoder logic 40 obtains the data word directly from CHAR without reading from vocabulary RAM 36 since it is an uncompressed data word. For every data word written to output FIFO buffer 44, decoder logic 40 simultaneously updates the decompressor vocabulary table located in vocabulary RAM 36 via vocabulary memory interface 34. A control signal DEC from control circuit 32 enables tri-state buffer 42 to pass the uncompressed data word through output FIFO buffer 44 as OBDATA (output bus data). Host interface 12 sends OBDATA to host controller 10 for storage or further transmission.

Applications for single and multiple channel data compression vocabularies are disclosed in U.S. Pat. No. 5,245,614 and is hereby incorporated by reference. Each input stream of digital data signals that is processed by a corresponding pair of compression and decompression vocabulary tables are referred to as a channel. In the case of a single channel data compression application, the CAM array provides the only compressor vocabulary table. In the case of a single channel data decompression application, vocabulary RAM 36 need contain the only decompression vocabulary table.

A different situation exists in the case of a multiple channel data compression and decompression application. In the latter case, the information from multiple channels may be transmitted in frames of data that are multiplexed. Each frame may include information regarding compression status and relationship to previous frames, e.g. channel information. When building a vocabulary table related to one particular frame, it is desirable to save that history for later use on subsequent frames from the same channel. That way if data compressor 14 is processing one or more frames using a first vocabulary table located within the CAM array and then receives a frame to be compressed using a second vocabulary table, the first vocabulary table may be saved in vocabulary RAM 36 and the second vocabulary table may be loaded into the CAM array. When a data frame arrives to be compressed using the second vocabulary table, the CAM array is reset and reloaded from the second vocabulary table stored in vocabulary RAM 36, effectively allowing VLSM 22 to continue processing where the first channel left off. This saves rebuilding the vocabulary table from scratch each time a frame from a different channel arrives for compression.

To accomplish the loading and unloading, VLSM 22 and encode logic 24 are connected through vocabulary memory interface 34 to vocabulary RAM 36. VLSM 22 may store characters in the local CAM array and completely update the corresponding instance of the vocabulary table stored in vocabulary RAM 36 from the CAM array when a frame from a different channel arrives. Another option is to update both the CAM array and vocabulary RAM 36 continuously as each data word is processed through VLSM 22 and encoder logic 24.

Figure 2:
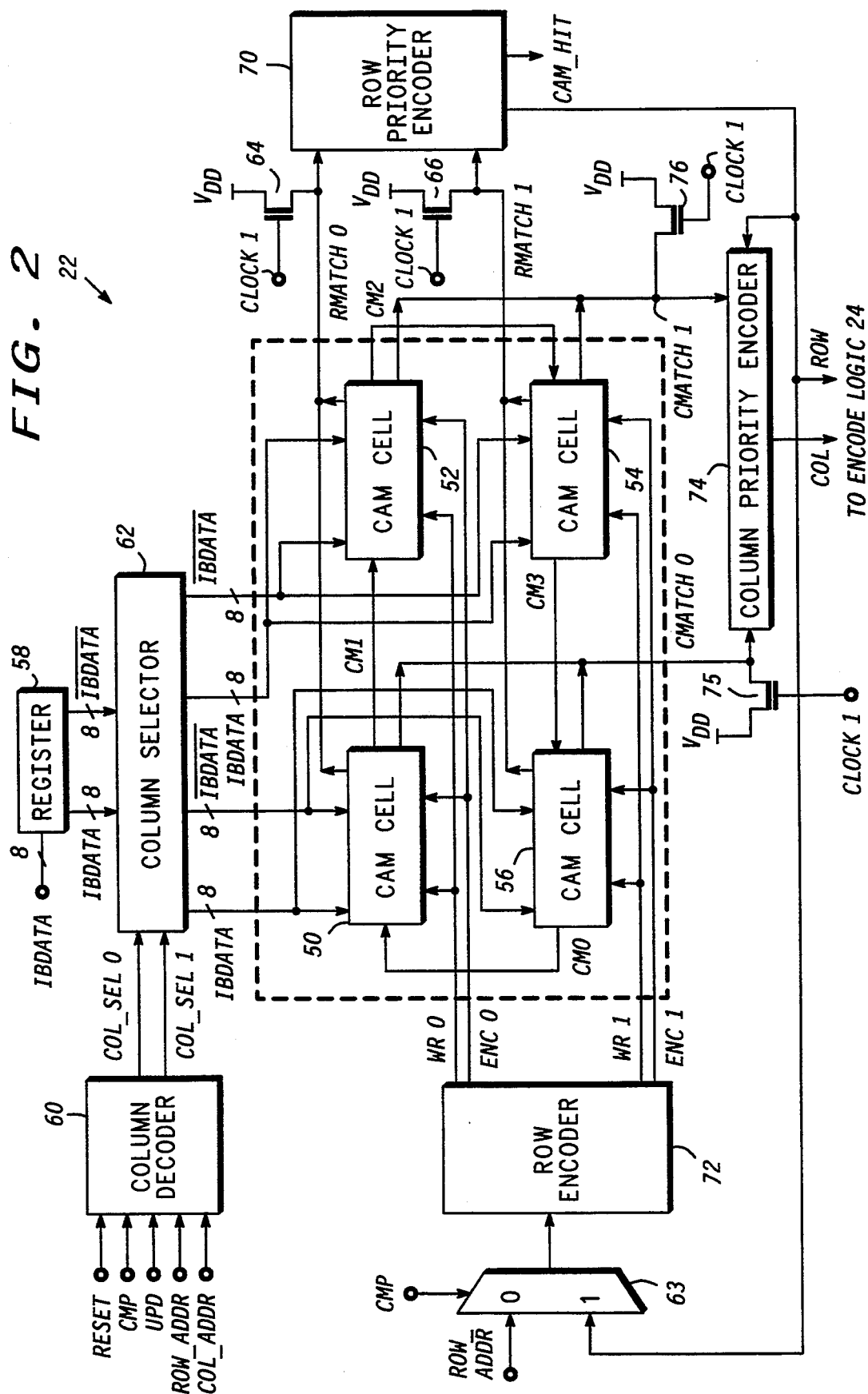
FIG. 2 is a block diagram illustrating the variable length string matcher of FIG. 1.

VLSM 22 is shown in FIG. 2 as a simplified 2×2 CAM array with CAM cells 50, 52, 54 and 56. In practice, CAM cell array 50–56 may be sixty-four rows with sixteen cells in each row for a total of 1024 cells. The operation of a full-size CAM array follows directly from the following example of the 2×2 CAM array. VLSM 22 receives uncompressed incoming data words IBDATA and checks for matches in the local vocabulary stored in CAM cells 50–56 which comprise a history of previous data. Register 58 stores IBDATA for use by the CAM array. The matching process includes a series of alternating compare and update phases. The INIT, CM and UPD control signals originate from the state machine (not shown) in encoder logic 24. A logic one CMP is asserted for the compare phase, and a logic one UPD is asserted for the update phase. The UPD and CMP control signals are mutually exclusive. The compare and update process continues until no more matches are found, or until a predefined maximum number of matches is reached, i.e. VLSM 22 has found the longest consecutive string of matches between the incoming data words and the contents of the vocabulary table. INIT initializes CM0–CM3 signals to logic zero at the beginning of each string match search. CAM_HIT from row priority encoder 70 signals encoder logic 24 each time a match is found.

Consider the data character string "A", "B", "A", "B", and "C" chronologically sent to VLSM 22. Assume the CAM array has been initialized to zero. During the first compare phase with the first data word "A", column decoder 60 enables column selector 62 to pass IBDATA and its complement $\overline{\text{IBDATA}}$ to all CAM cells 50–56 simultaneously. That is, every CAM cell in every column is enabled to compare the incoming data word "A" with the contents of the CAM array. The first character "A" finds no match in CAM cells 50–56 during the first compare phase since the CAM array was initially empty. Control signals CM0, CM1, CM2 and CM3 (cell match) are logic zero indicating no match to the next CAM cell. Output signal CAM_HIT remains inactive.

Next, a logic one control signal UPD (update) activates the update phase. The data word "A" is placed in the next available location, i.e. CAM cell 50, during the update phase. An external counter (not shown) in encoder logic 24 keeps track of the next available location in the CAM cell array and provides its address as VADDR (vocabulary address). VLSM 22 splits VADDR into ROW_ADDR (row address) and COL_ADDR (column address). ROW_ADDR represents the most significant bits and COL_ADDR represents the least significant bits of the address of the next available location. For the update phase, COL_ADDR and ROW_ADDR control column selector 62 to enable one particular column, see FIG. 3 and associated text infra. The CMP signal is logic zero during the update phase to control multiplexer 63 and pass ROW_ADDR which enables a write operation to the proper row with control signal WR0 (write row). The WR1 control signal enables writing to CAM cells 54 and 56 when activated. The row and column address thus provides for the update of the data word "A" into CAM cell 50.

Since there was no match, the first data word "A" is also sent to encode logic 24 for transmission to host controller 10 in uncompressed format. A 2-bit length code "00" is sent to identify "A" as uncompressed data. Likewise, the first "B" finds no match in the CAM array and is placed in CAM cell 52. The data word "B" is also sent to encode logic 24 for transmission to host controller 10 in uncompressed format. The CAM array now has a vocabulary history of "A" and "B" in CAM cells 50 and 52, respectively.

When the third data word "A" arrives, column decoder 60 again enables column selector 62 to pass IBDATA and its complement $\overline{\text{IBDATA}}$ to all CAM cells 50–56 simultaneously. Transistors 64 and 66 precharge RMATCH0 and RMATCH1 to logic one each high state of CLOCK1. The row of CAM cells containing a match are indicated by logic zero for RMATCH0 and/or RMATCH1 (row match). CAM cell 50 detects a match between the incoming data word "A" and the previously stored "A". The CM1 signal goes to logic one and is stored in CAM cell 52. The control signals CM0, CM1, CM2 and CM3 pass along the status of a match in the previous CAM cell to the next logical CAM cell. A match in CAM cell 50 activates control signal CM1 to CAM cell 52, while a match in CAM cell 52 activates control signal CM2 to CAM cell 54. A match in CAM cell 54 activates control signal CM3 to CAM cell 56, and a match in CAM cell 56 activates control signal CM0 to CAM cell 50. An alternate embodiment of CAM cells 50–56 would pass data signals instead of match status.

RMATCH0 is asserted because the incoming data word "A" matches the contents of CAM cell 50 in the first row. Row priority encoder 70 selects the least significant CAM row which indicates an active RMATCH. CAM row 50–52 is defined as less significant than CAM row 54–56. If RMATCH0 is asserted at logic zero, ROW is logic zero. If RMATCH1 is asserted at logic zero, and RMATCH0 is not asserted, ROW is logic one. If both RMATCH0 and RMATCH1 are both asserted, ROW is logic zero because RMATCH0 is less significant. Row priority encoder 70 outputs only one bit for the ROW address since the CAM array is only 2×2. For a full CAM array with sixty-four rows and 1024 total cells, ROW is a 6-bit address. Row priority encoder 70 also asserts CAM HIT signal each time an RMATCH signal is asserted. An example of row priority encoder 70 may be found as Motorola part number MC14532B priority encoder.

The third data word "A" is also placed in CAM cell 54 to update the vocabulary table as described above. The ROW address from row priority encoder 70 is sent to row decoder 72 to select one of $2^n$ enable lines according to the ROW address, where "n" is the number of address bits. The ENC0 signal enables CAM row 50–52 because it is the least significant row having a match. The ENC0 signal also activates the CMATCH0 or CMATCH1 (column match) for the CAM cell having stored a CM match from the previous cell. Transistors 75 and 76 precharge CMATCH0 and CMATCH1 to logic one each CLOCK1 cycle. Thus far, the logic one from CM1 is stored in CAM cell 52.

The fourth data word "B" is compared to the contents of CAM cell 52 and another match is found. A logic one CM2 passes to CAM cell 54. RMATCH0 is again asserted at logic zero and row priority encoder 70 outputs a logic zero ROW address. The fourth data word "B" is placed in CAM cell 56.

Figure 5:
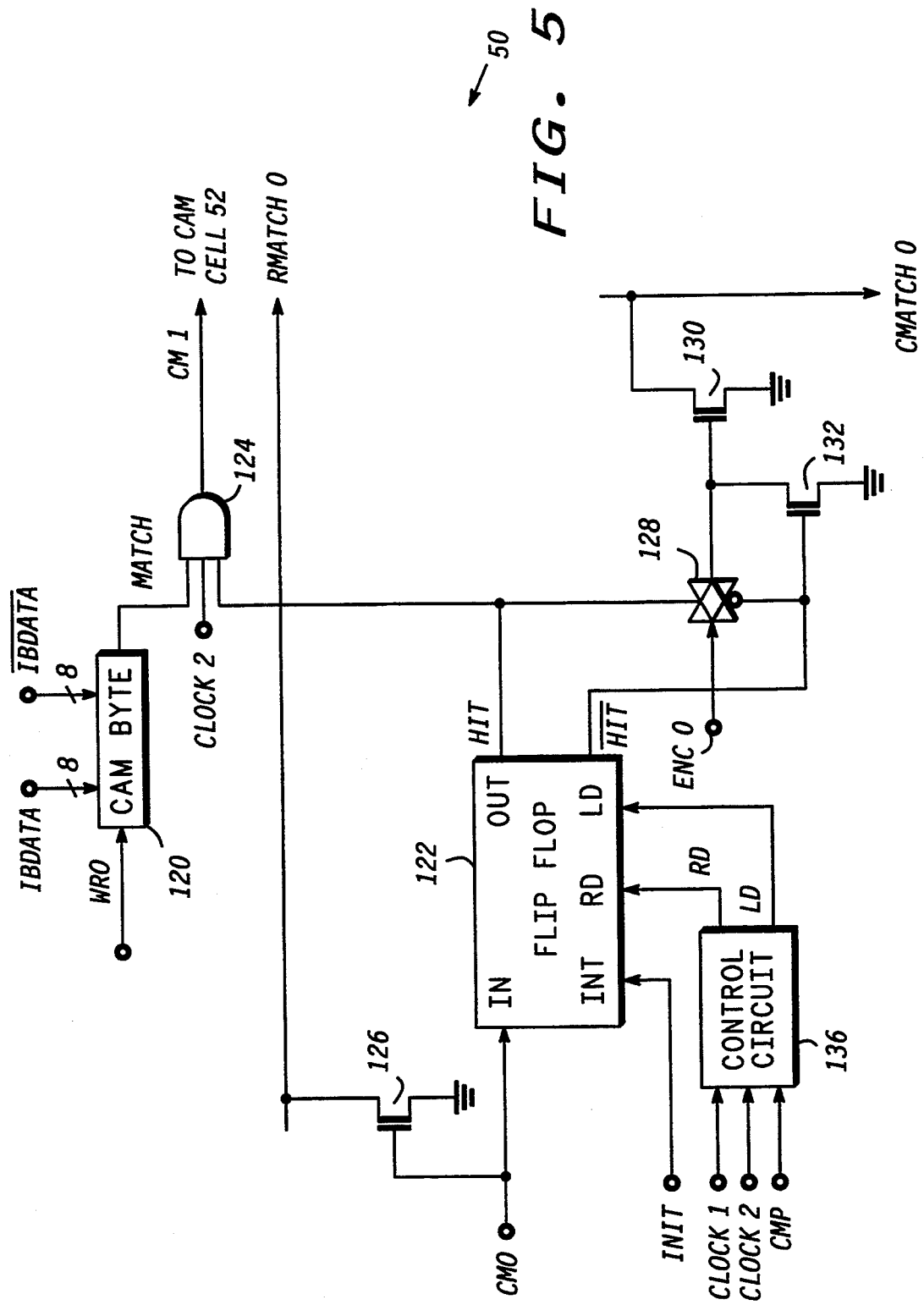
FIG. 5 is a schematic and block diagram illustrating the CAM cell of FIG. 2.

The ENC0 and ENC1 (encode) signals are actually utilized only if the next incoming data word fails to find a match, see discussion of CAM cell 50 with FIG. 5 infra. Otherwise, a subsequent match updates the ROW signal as per row priority encoder 70 and possibly changes the active ENC0 and ENC1 control signals. It is possible for two or more rows of the CAM array to each find a match with the first incoming data word. At that time, it is unknown which row contains the longest string match to the still to come data stream.

Once the next incoming data word "C" fails to match the next CAM cell 54, the most recent RMATCH and CMATCH provides row and column information of the location. In this example, RMATCH0 and CMATCH1 are asserted and the row priority encoder 70 and column priority encoder 74 produce ROW and COL, respectively, representing the address of CAM cell 52. The ROW and COL signals are passed to encode logic 24 to generate LEN and LOC. The combination of ROW and COL actually points to the last location in the string match. Encode logic 24 subtracts LEN from the ROW and COL address to find the starting address of the string match.

For the layout of the CAM array in an integrated circuit, the first row of interconnecting CAM cells are disposed on an IC in adjacent locations such that the CM line of one CAM cell is connected to the next CAM cell with minimal track routing. The logical flow of cell match signals CMi is from left to right, e.g. CAM cell 50 to CAM cell 52, through the CAM cells of the first row. A second row of CAM cells are disposed on the IC directly beneath the first row. Additional rows may be laid forming a two dimensional matrix. The logical flow of cell match signals CMi continues from right to left, e.g. CAM cell 54 to CAM cell 56, through the CAM cells of the second row. Thus, CAM cells 50-56 are respectively increasing in significance. The right-most CAM-cell in the first row, e.g. CAM cell 52, is connected to the right-most CAM cell, e.g. CAM cell 54, in the second row thus minimizing track routing. Likewise, the left-most CAM cell in the second row is connected to the left-most CAM cell in the third row. The last CAM cell in the last row is connected to the left-most CAM cell in the first row, thereby completing the loop. The resulting serpentine interconnecting scheme has the advantage of minimizing track routing between CAM cells and simplifying the layout design.

Special consideration must be given to both column decoder 60 and column priority encoder 74. The least significant CAM cell in the even rows of the CAM array is the left-most cell. The least significant CAM cell in the odd rows of the CAM array is the right-most cell. Thus, priority is given to the less significant CAM cells in even rows and to the less significant CAM cells in odd rows. Yet the serpentine interconnecting scheme designates the next logical CAM cell following the right-most, most significant CAM cell in an even row to be the right-most, least significant CAM cell in an odd row. Moreover, the least significant CAM cell in the even row is coupled to the same CMATCH0 line as the most significant CAM cell in the odd row. Therefore, column priority encoder 74 must reverse the physical order of its inputs on every other row, see discussion regarding FIG. 8 infra. The least significant bit(s) of ROW from the row priority encoder 70 controls column priority encoder 74.

Figure 3:
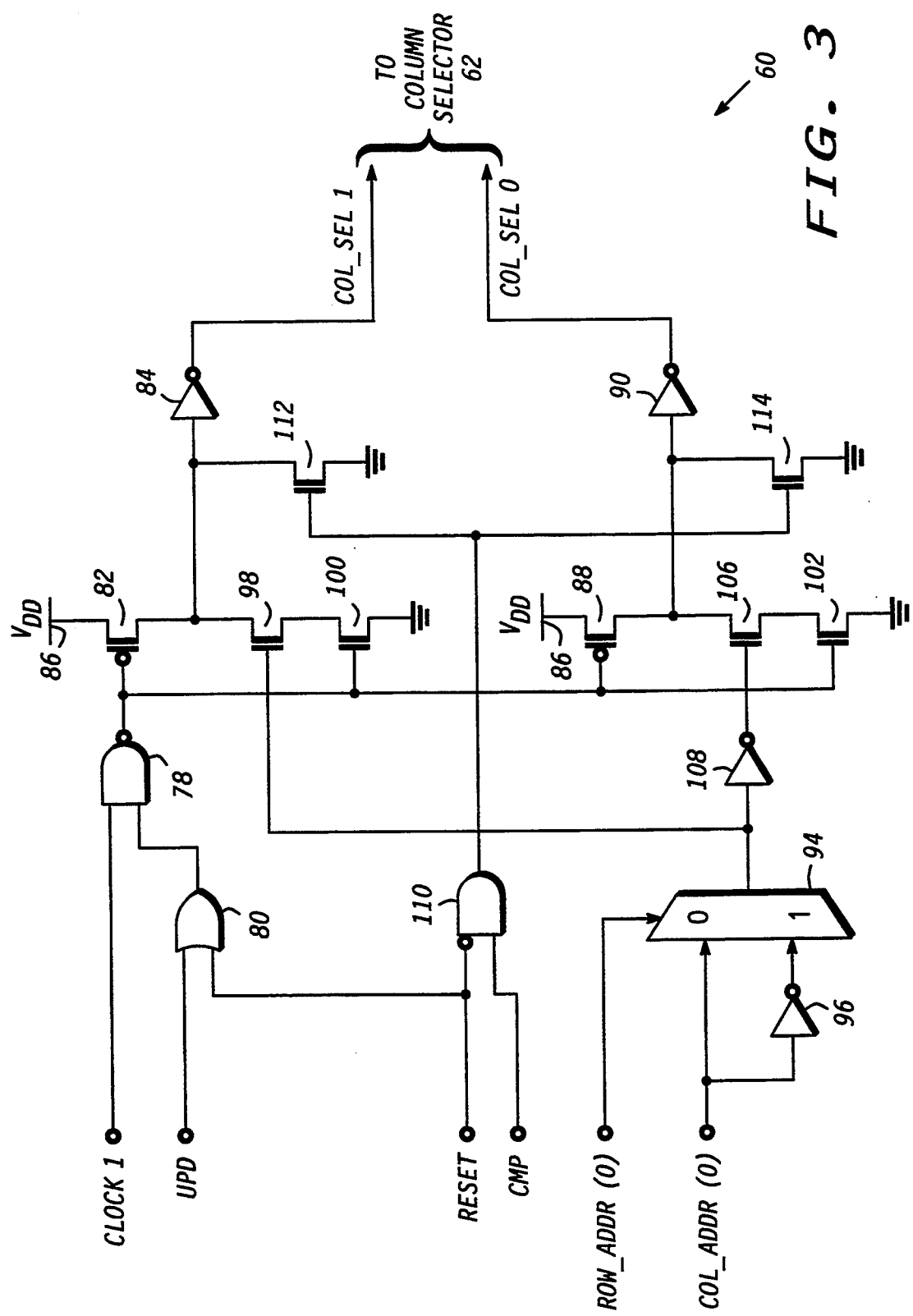
FIG. 3 is a schematic diagram illustrating the column decoder of FIG. 2.

Turning to FIG. 3, further detail of column decoder 60 is shown including NAND gate 78 receiving CLOCK1 as one phase of the system clock. The CLOCK1 and CLOCK2 signals are non-overlapping opposite phases of the system clock operating at say 20 MHz. An example of a circuit to generate the CLOCK1 and CLOCK2 clock signals from the main system clock is disclosed in U.S. Pat. No. 5,212,412 and hereby incorporated by reference. OR gate 80 receives UPD and RESET at its inputs for providing a second input to NAND gate 78. When RESET is asserted at logic one, the output of NAND gate 78 goes to logic zero at the high state CLOCK1 and turns on transistors 82 and 88 and turns off transistors 100 and 102. The input of inverter 84 and the input of inverter 90 become logic one by way of power supply conductor 86 operating at a positive potential such as $V_{DD}$. The COL_SEL1 signal at the output of inverter 84 and the COL_SEL0 signal at the output of inverter 90 become logic zero and disable transmission of IBDATA and $\overline{\text{IBDATA}}$ through column selector 62 to CAM cells 52 and 54 and to CAM cells 50 and 56, respectively.

The update of a CAM cell occurs during CLOCK2. CLOCK1 is thus logic zero to produce a logic one at the output of NAND gate 78. Transistors 100 and 102 are enabled by a logic one at the output of NAND gate 78. The least-significant bit of ROW_ADDR controls multiplexer 94 to pass COL_ADDR, or its complement $\overline{\text{COL\_ADDR}}$ by way of inverter 96, to its output to select one column of the CAM array during the update phase. A logic one at the output of multiplexer 94 turns on transistor 98 and pulls the input of inverter 84 to logic zero and COL_SEL1 to logic one. Column selector 62 passes IBDATA and $\overline{\text{IBDATA}}$ to CAM cells 52 and 54. A logic zero at the output of multiplexer 94 turns off transistor 98 and turns on transistor 106 because of inverter 108. The input of inverter 90 goes to logic zero and COL_SEL becomes logic one to enable IBDATA and $\overline{\text{IBDATA}}$ to CAM cells 50 and 56.

For the compare phase, control signal CMP is logic one and RESET is logic zero to provide a logic one at the output of AND gate 110 and turn on transistors 112 and 114. The inputs of inverters 84 and 90 are pulled to logic zero. The COL_SEL0 and COL_SEL1 control signals go to logic one and enable IBDATA and $\overline{\text{IBDATA}}$ to pass through column selector 62 to all CAM cells 50-56.

Figure 4:
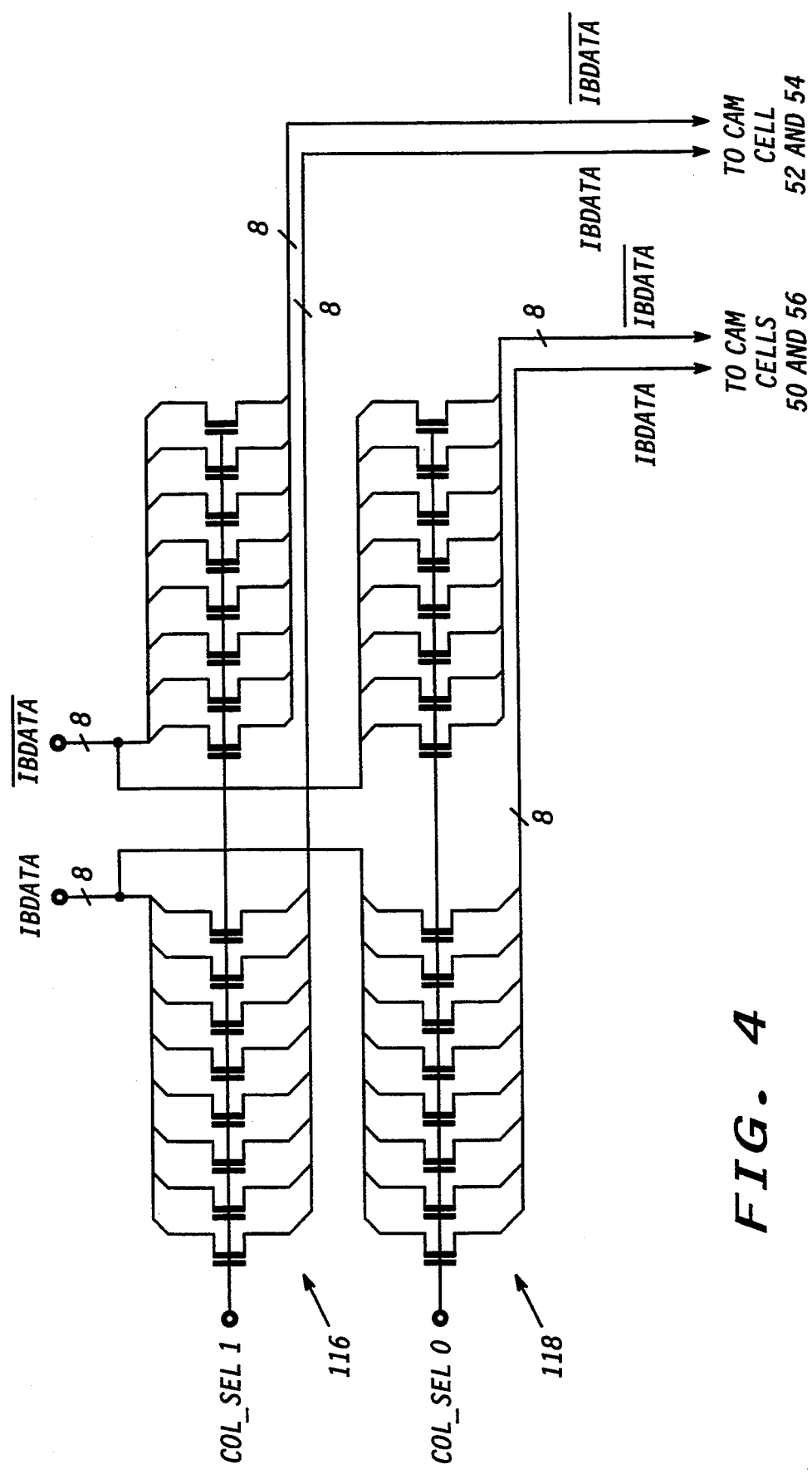
FIG. 4 is a schematic diagram illustrating the column selector of FIG. 2.

Column selector 62 is shown in FIG. 4. A logic one COL_SEL1 turns on transistor array 116 to pass IBDATA and $\overline{\text{IBDATA}}$ to CAM cells 52 and 54. A logic zero COL_SEL1 turns off transistor array 116 to block IBDATA and $\overline{\text{IBDATA}}$. A logic one COL_SEL0 turns on transistor array 118 to pass IBDATA and $\overline{\text{IBDATA}}$ to CAM cells 50 and 56. A logic zero COL_SEL0 turns off transistor array 118 to block IBDATA and $\overline{\text{IBDATA}}$.

In FIG. 5, CAM cell 50 is shown as representative of the other CAM cells. An example of one of the eight bits of CAM byte 120 is disclosed in U.S. Pat. No. 4,538,243 and is hereby incorporated by reference. Briefly, CAM byte 120 performs a compare function between the IBDATA and its existing contents. If IBDATA matches the prior stored contents, MATCH is asserted to logic one. The CM1 control signal becomes asserted at logic one when MATCH, CLOCK2 and HIT from master-slave flipflop 122 are logic ones at the inputs of AND gate 124. CM1 goes to a flipflop like 122 in CAM cell 52. The CM0 control signal from CAM cell 56 enables transistor 126 to assert RMATCH0 as logic zero. A logic one HIT signal from flipflop 122 also enables transmission gate 128 to pass the ENC0 control signal from row decoder 72 to turn on transistor 130 and assert CMATCH0 as logic zero when ENC0 is active. When $\overline{\text{HIT}}$ is logic one, transmission gate 128 is disabled and transistor 132 turns on to hold transistor 130 off. Control circuit 136 provides control signals RD (read) and LD (load) to clock flipflop 122 as described below. Note only one control circuit 136 is used to send control signals LD and RD to flipflops like 122 in all CAM cells. CAM byte 120 stores IBDATA upon receiving a WR0 control signal. In an alternate embodiment, CAM byte 120 could output data instead of a match status signal.

All transmission gates described herein may be implemented as back-to-back P-channel and N-channel transistors (not shown) with their drains and sources coupled together, as is well known. The inverted input is the gate of the P-channel transistor, and the non-inverted input is the gate of the N-channel transistor.

Figure 6:
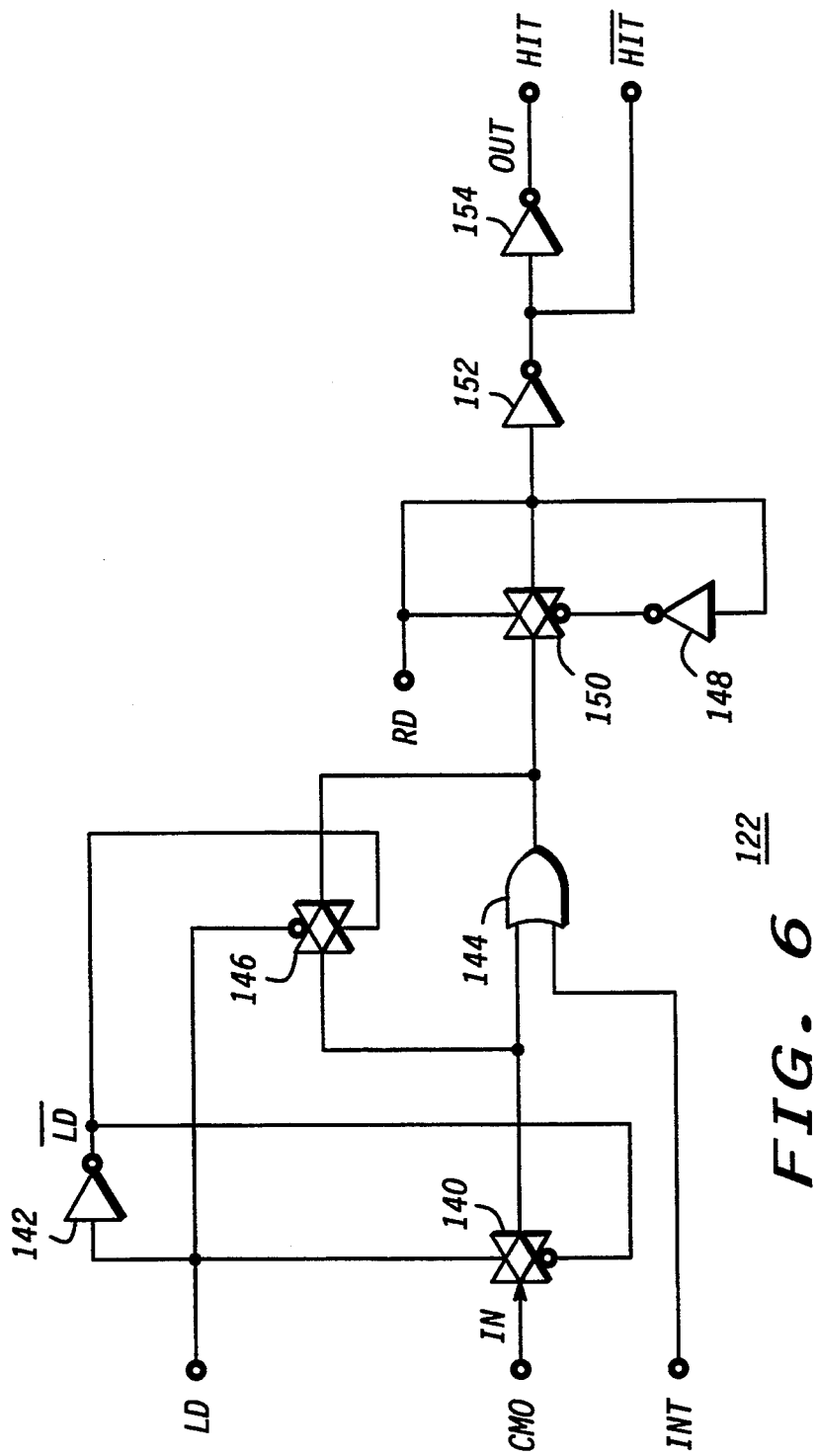
FIG. 6 is a schematic diagram illustrating the flipflop of FIG. 5.

As part of the present invention, flipflop 122 is shown in FIG. 6 including transmission gate 140 receiving the CM0 control signal from CAM cell 56. The LD control signal and its complement $\overline{\text{LD}}$ through inverter 142 enable transmission gate 140. Either the CM0 control signal or an INIT (initialize) control signal from the state machine (not shown) in encoder logic 24 produces a logic one at the output of OR gate 144. INT is asserted to logic one at the beginning of each string match. Transmission gate 146 latches the logic one in place when LD and $\overline{\text{LD}}$ control signals change state to logic zero and logic one, respectively. The RD control signal and its complement $\overline{RD}$ through inverter 148 enables transmission gate 150 to pass the output state of OR gate 144 to inverters 152 and 154. $\overline{HIT}$ is taken at the output of inverter 152 while HIT is taken at the output of inverter 154. The LD signal loads the CM0 signal into the master section flipflop 122, e.g. circuit 140–146. The RD signal passes the stored logic state to the output of flipflop 122. The LD signal is asserted at logic one only during CMP and CLOCK2. The RD signal is asserted otherwise. Thus, RD and LD are mutually exclusive and non-overlapping. Flipflop 122 operates to store the match from the adjacent CAM cell generated during the previous compare phase. Therefore, a match detected in CAM byte 120 results in flipflop like 122 in CAM cell 52 storing a logic one from CM1.

Figure 7:
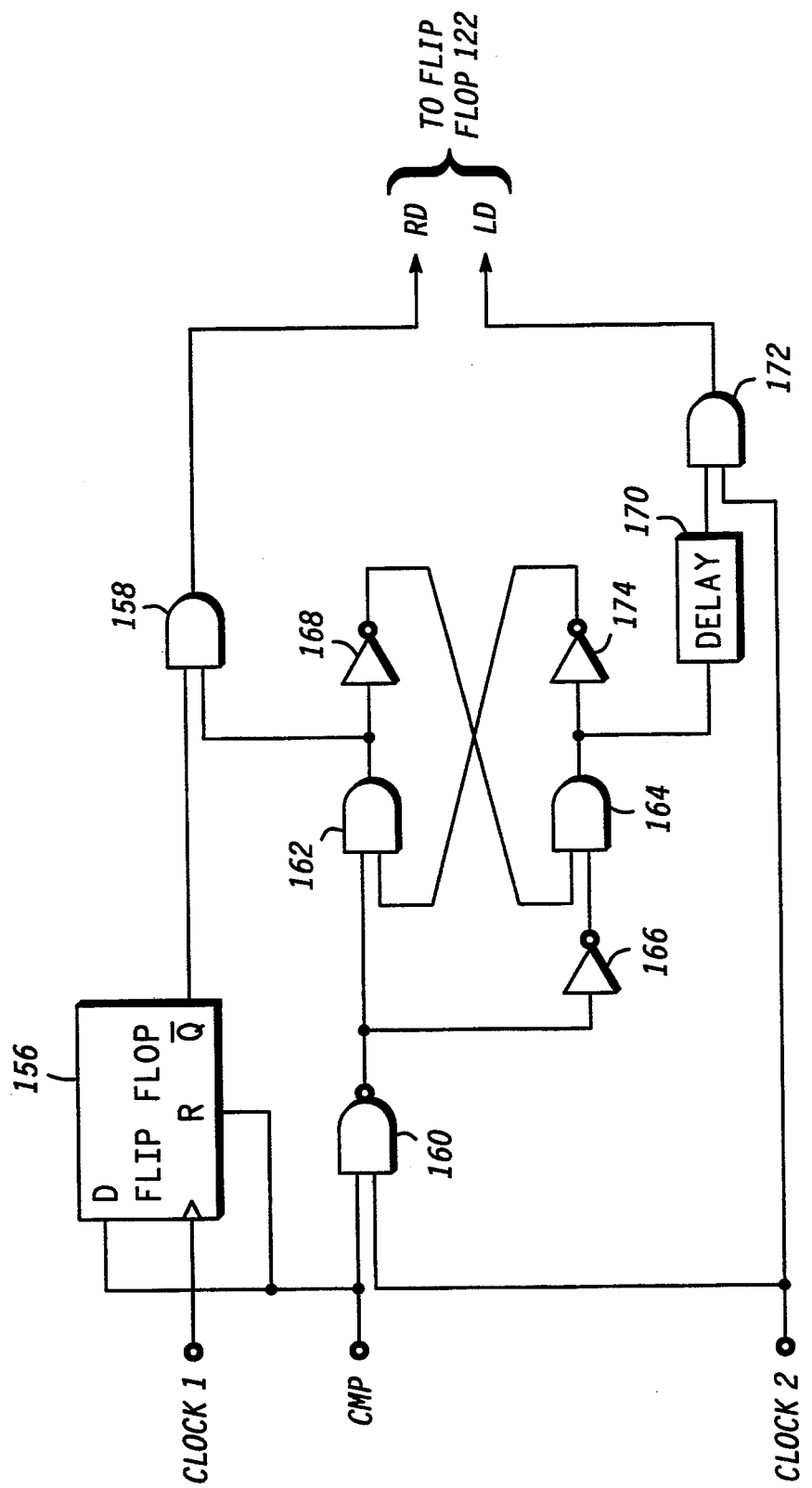
FIG. 7 is a schematic diagram illustrating the control circuit of FIG. 5.

FIG. 7 illustrates another part of the present invention as control circuit 136 receiving CMP, CLOCK1 and CLOCK2. Note that only one control circuit 136 is used to send control signals LD and RD to flipflops like 122 in all CAM cells. A D-type flipflop 156 receives CMP at its data and reset inputs and CLOCK1 at its clock input. The output of flipflop 156 is applied to one input of AND gate 158. The output of AND gate 158 provides the RD control signal to flipflop 122. The CMP and CLOCK2 signals are applied to NAND gate 160 which drives one input of AND gate 162 and one input of AND gate 164 through inverter 166. The output of AND gate 162 is applied to the second input of AND gate 158 and also inverted by inverter 168 to the second input of AND gate 164. The output of AND gate 164 is applied through delay circuit 170 to one input of AND gate 172 and also inverted by inverter 174 to the second input of AND gate 162. AND gate 172 also receives the CLOCK2 signal and provides the LD control signal at its output to flipflop 122.

The delay required by flipflop 122 may vary depending on the interval between compare phases, which depends on the availability of data words in input FIFO buffer 20, and on the number of clock cycles required to write data words into vocabulary RAM 36 during the intervening update phase. Recognizing that one flipflop 122 is required by each CAM cell in the CAM array, which typically dominates the area of the IC, it is important to minimize the number of gates in each flipflop 122. In order to retain the state of flipflop 122 for an indefinite delay, control signals RD and LD are used as an alternative to prior art multiple flipflop schemes that are controlled directly by the system clock. Flipflop 122 is a single flipflop that is able to provide an indefinite delay. By choosing control signals RD and LD to be non-overlapping and mutually exclusive the slave stage of flipflop 122 does not require refresh logic.

Figure 8:
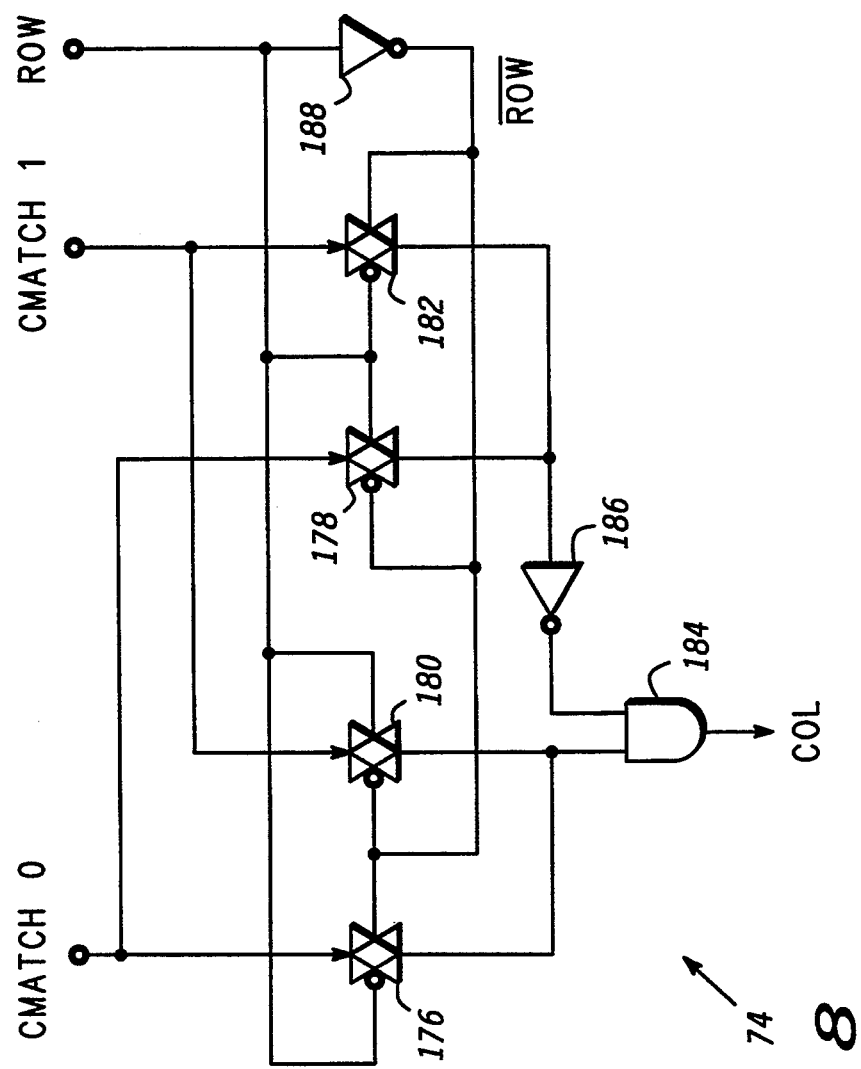
FIG. 8 is a schematic diagram illustrating the column priority encoder of FIG. 2.

Referring to FIG. 8, column priority encoder 74 is shown for the 2×2 CAM cell configuration. The CMATCH0 signal is applied to inputs of transmission gates 176 and 178. Similarly, the CMATCH1 signal is applied to inputs of transmission gates 180 and 182. The outputs of transmission gates 176 and 180 are coupled together to a first input of AND gate 184. The outputs of transmission gates 178 and 182 are coupled together through inverter 186 to a second input of AND gate 184. The ROW address controls the inverted control input of transmission gate 176 and the non-inverted control input of transmission gate 180. The ROW address also controls the inverted control input of transmission gate 182 and the non-inverted control input of transmission gate 178. The $\overline{ROW}$ address following inverter 188 controls the inverted control input of transmission gate 180 and the non-inverted control input of transmission gate 176. The $\overline{ROW}$ address also controls the inverted control input of transmission gate 178 and the non-inverted control input of transmission gate 182.

The function of priority encoder 74 is to prioritize columns in even rows, e.g. CAM cells 50–52, from least-significant cell (left-most) to most-significant cell (right-most). Priority is also given to the less significant cells, e.g. CAM cell 54, in odd rows. However in odd rows, e.g. CAM cells 54–56, the least-significant cell is right-most and the most-significant cell is left-most. Therefore, prioritization must be reversed to give priority to the less significant cells, e.g. CAM cell 54, in odd rows. The need to reverse significance from even rows to odd rows results from the serpentine configuration of the CAM cell array. The flow of cell match signals CMi wraps around from CAM cell 52 in the first row to CAM cell 54 in the second row. Thus, column priority encoder 74 reverses the physical order of its inputs for odd rows with respect to even rows by a front-end multiplexing scheme to a column priority encoder to achieve the desired priority reversal.

Consider the 2×2 CAM array arrangement supported in FIG. 8. Assume CMATCH0 and CMATCH1 are both asserted as logic zero. If ROW is logic zero and $\overline{ROW}$ is logic one, i.e. the first (even) row with CAM cells 50–52 is selected, then transmission gates 176 passes CMATCH0 to the first input of AND gate 184 and transmission gate 182 passes CMATCH1 through inverter 186 to the second input of AND gate 184. The COL address becomes logic zero giving priority to CMATCH0 because it is least significant in the first row. The column with CAM cells 50 and 56 is selected. If CMATCH0 is logic one and CMATCH1 is logic zero, AND gate 184 receives two logic ones and outputs a logic one COL, thereby selecting the column with CAM cells 52 and 54.

Now suppose ROW is logic one and $\overline{ROW}$ is logic zero, i.e. the second (odd) row with CAM cells 54–56 is selected. Again, CMATCH0 and CMATCH1 are both asserted as logic zero. Transmission gate 180 passes CMATCH1 to the first input of AND gate 184 and transmission gate 178 passes CMATCH0 through inverter 186 to the second input of AND gate 184. The COL address becomes logic zero giving priority to CMATCH1 because it is the least significant column in the second (odd) row. The column with CAM cells 52 and 54 is selected. If CMATCH0 is logic zero and CMATCH1 is logic one, AND gate 184 receives two logic ones and outputs a logic one COL, thereby selecting the column with CAM cells 50 and 56.

For larger CAM arrays, priority selected may be expanded to operate as described above. For example, AND gate 184 and inverter 186 may be replaced by Motorola part number MC14532B Column Encoder. The column inputs may be reversed by a similar front-end multiplexing scheme to a column priority encoder as shown in FIG. 8.

Hence, a key feature of the present invention is to implement the CAM cell array with a single flipflop as described above using a common control circuit to generate control signals to transfer data through the flipflop and refresh its contents.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A circuit, comprising:
   a first flipflop having a data input, a read input, a load input and an output, said data input being coupled for receiving a first data signal, said read input being coupled for receiving a read control signal, said load input being coupled for receiving a load control signal, said output latching said first data signal upon receiving said load control signal followed by said read control signal; and
   a control circuit having first and second outputs for respectively providing said read control signal and said load control in a mutually exclusive and non-overlapping manner.

2. The circuit of claim 1 wherein said first flipflop includes:
   a first transmission gate having an input, first and second control inputs and an output, said input being coupled for receiving said first data signal, said first control input being coupled for receiving said load control signal, said second control input being coupled for receiving an inverted load control signal;
   an OR gate having first and second inputs and an output, said first input being coupled to said output of said first transmission gate, said second input being coupled for receiving an initialize signal; and
   a second transmission gate having an input, first and second control inputs and an output, said input being coupled to said output of said OR gate, said first control input being coupled for receiving said inverted load control signal, said second control input being coupled for receiving said load control signal, said output being coupled to said first input of said OR gate.

3. The circuit of claim 2 wherein said first flipflop further includes:
   a third transmission gate having an input, first and second control inputs and an output, said input being coupled to said output of said OR gate, said first control input being coupled for receiving said read control signal, said second control input being coupled for receiving an inverted read control signal;
   a first inverter having an input and an output, said input being coupled to said output of said third transmission gate, said output being coupled for providing an inverted output signal of said first flipflop; and
   a second inverter having an input and an output, said input being coupled to said output of said first inverter, said output being coupled for providing an output signal of said first flipflop.

4. The circuit of claim 3 further including:
   a data storage circuit having an input coupled for receiving input data and an output for providing an output signal having a first state when said input data matches contents of said data storage circuit; and
   a first AND gate having first and second inputs and an output, said first input being coupled for receiving said output signal of said data storage circuit, said second input being coupled for receiving said first data signal from said output of said first flipflop, said output being coupled for providing a second data signal.

5. The circuit of claim 4 wherein said control circuit includes:
   a second flipflop having a data input, a clock input, a reset input and an output, said data input and said reset input being coupled for receiving a compare control signal, said clock input being coupled for receiving a first clock signal;
   a first NAND gate having first and second inputs and an output, said first input being coupled for receiving said compare control signal, said second input being coupled for receiving a second clock signal;
   a second AND gate having first and second inputs and an output, said first input being coupled to said output of said first NAND gate;
   a third AND gate having first and second inputs and an output, said first input being coupled to said output of said second flipflop, said second input being coupled to said output of said second AND gate, said output being coupled for providing said read control signal;
   a third inverter having an input coupled to said output of said first NAND gate and having an output;
   a fourth inverter having an input coupled to said output of said second AND gate and having an output;
   a fourth AND gate having first and second inputs and an output, said first input being coupled to said output of said third inverter, said second input being coupled to said output of said fourth inverter; and
   a fifth inverter having an input coupled to said output of said fourth AND gate and having an output coupled to said second input of said second AND gate.

6. The circuit of claim 5 wherein said control circuit further includes:
   a delay circuit having an input coupled to said output of said fourth AND gate and having an output; and
   a fifth AND gate having first and second inputs and an output, said first input being coupled for receiving said second clock signal, said second input being coupled to said output of said delay circuit, said output being coupled for providing said load control signal.

7. A CAM cell, comprising:
   a data storage circuit having an input coupled for receiving input data and an output for providing an output signal having a first state when said input data matches contents of said data storage circuit;
   a first flipflop having a data input, a read input, a load input and an output, said data input being coupled for receiving a first data signal, said read input being coupled for receiving a read control signal, said load input being coupled for receiving a load control signal, said output latching said first data signal upon receiving said load control signal followed by said read control signal;
   a control circuit having first and second outputs for providing said read control signal and said load control respectively; and
   a first AND gate having first and second inputs and an output, said first input being coupled for receiving said output signal of said data storage circuit, said second input being coupled for receiving said first data signal from said output of said first flipflop, said output being coupled for providing a second data signal.

8. The CAM cell of claim 7 wherein said first flipflop includes:
a first transmission gate having an input, first and second control inputs and an output, said input being coupled for receiving said first data signal, said first control input being coupled for receiving said load control signal, said second control input being coupled for receiving an inverted load control signal;
an OR gate having first and second inputs and an output, said first input being coupled to said output of said first transmission gate, said second input being coupled for receiving an initialize signal; and
a second transmission gate having an input, first and second control inputs and an output, said input being coupled to said output of said OR gate, said first control input being coupled for receiving said inverted load control signal, said second control input being coupled for receiving said load control signal, said output being coupled to said first input of said OR gate.

9. The CAM cell of claim 8 wherein said first flipflop further includes:
a third transmission gate having an input, first and second control inputs and an output, said input being coupled to said output of said OR gate, said first control input being coupled for receiving said read control signal, said second control input being coupled for receiving an inverted read control signal;
a first inverter having an input and an output, said input being coupled to said output of said third transmission gate, said output being coupled for providing an inverted output signal of said first flipflop; and
a second inverter having an input and an output, said input being coupled to said output of said first inverter, said output being coupled for providing an output signal of said first flipflop.

10. The CAM cell of claim 9 wherein said control circuit includes:
a second flipflop having a data input, a clock input, a reset input and an output, said data input and said reset input being coupled for receiving a compare control signal, said clock input being coupled for receiving a first clock signal;
a first NAND gate having first and second inputs and an output, said first input being coupled for receiving said compare control signal, said second input being coupled for receiving a second clock signal;
a second AND gate having first and second inputs and an output, said first input being coupled to said output of said first NAND gate;
a third AND gate having first and second inputs and an output, said first input being coupled to said output of said second flipflop, said second input being coupled to said output of said second AND gate, said output being coupled for providing said read control signal;
a third inverter having an input coupled to said output of said first NAND gate and having an output;
a fourth inverter having an input coupled to said output of said second AND gate and having an output;
a fourth AND gate having first and second inputs and an output, said first input being coupled to said output of said third inverter, said second input being coupled to said output of said fourth inverter; and
a fifth inverter having an input coupled to said output of said fourth AND gate and having an output coupled to said second input of said second AND gate.

11. The CAM cell of claim 10 wherein said control circuit further includes:
a delay circuit having an input coupled to said output of said fourth AND gate and having an output; and
a fifth AND gate having first and second inputs and an output, said first input being coupled for receiving said second clock signal, said second input being coupled to said output of said delay circuit, said output being coupled for providing said load control signal.

12. A circuit, comprising:
a data storage circuit having an input coupled for receiving input data and an output for providing an output signal having a first state when said input data matches contents of said data storage circuit;
a first flipflop having a data input, a read input, a load input and an output, said data input being coupled for receiving a first data signal, said read input being coupled for receiving a read control signal, said load input being coupled for receiving a load control signal, said output latching said first data signal upon receiving said load control signal followed by said read control signal;
a control circuit having first and second outputs for providing said read control signal and said load control respectively; and
circuit means for providing a second data signal upon receiving said output signal of said data storage circuit and said first data signal from said output of said first flipflop.

13. The CAM cell of claim 12 wherein said first flipflop includes:
a first transmission gate having an input, first and second control inputs and an output, said input being coupled for receiving said first data signal, said first control input being coupled for receiving said load control signal, said second control input being coupled for receiving an inverted load control signal;
an OR gate having first and second inputs and an output, said first input being coupled to said output of said first transmission gate, said second input being coupled for receiving an initialize signal; and
a second transmission gate having an input, first and second control inputs and an output, said input being coupled to said output of said OR gate, said first control input being coupled for receiving said inverted load control signal, said second control input being coupled for receiving said load control signal, said output being coupled to said first input of said OR gate.

14. The CAM cell of claim 13 wherein said first flipflop further includes:
a third transmission gate having an input, first and second control inputs and an output, said input being coupled to said output of said OR gate, said first control input being coupled for receiving said read control signal, said second control input being coupled for receiving an inverted read control signal;
a first inverter having an input and an output, said input being coupled to said output of said third transmission gate, said output being coupled for providing an inverted output signal of said first flipflop; and a second inverter having an input and an output, said input being coupled to said output of said first inverter, said output being coupled for providing an output signal of said first flipflop.

15. The CAM cell of claim 14 wherein said control circuit includes:

a second flipflop having a data input, a clock input, a reset input and an output, said data input and said reset input being coupled for receiving a compare control signal, said clock input being coupled for receiving a first clock signal;

a first NAND gate having first and second inputs and an output, said first input being coupled for receiving said compare control signal, said second input being coupled for receiving a second clock signal;

a first AND gate having first and second inputs and an output, said first input being coupled to said output of said first NAND gate;

a second AND gate having first and second inputs and an output, said first input being coupled to said output of said second flipflop, said second input being coupled to said output of said first AND gate, said output being coupled for providing said read control signal;

a third inverter having an input coupled to said output of said first NAND gate and having an output;

a fourth inverter having an input coupled to said output of said first AND gate and having an output;

a third AND gate having first and second inputs and an output, said first input being coupled to said output of said third inverter, said second input being coupled to said output of said fourth inverter; and a fifth inverter having an input coupled to said output of said third AND gate and having an output coupled to said second input of said first AND gate.

16. The CAM cell of claim 15 wherein said control circuit further includes:

a delay circuit having an input coupled to said output of said third AND gate and having an output; and a fourth AND gate having first and second inputs and an output, said first input being coupled for receiving said second clock signal, said second input being coupled to said output of said delay circuit, said output being coupled for providing said load control signal.

17. The CAM cell of claim 16 wherein said circuit means includes a fifth AND gate having first and second inputs and an output, said first input being coupled for receiving said output signal of said data storage circuit, said second input being coupled for receiving said first data signal from said output of said first flipflop, said output being coupled for providing said second data signal.

* * * * *